US006953751B2

(12) United States Patent
Detterbeck et al.

(10) Patent No.: US 6,953,751 B2
(45) Date of Patent: Oct. 11, 2005

(54) MICRO DEVICE AND PROCESS FOR PRODUCING IT

(75) Inventors: Manfred Detterbeck, Neuchatel (CH); Stefan Lutter, Neuchatel (CH); Mathieu Burri, Court (CH); Theo Hartmann, Nuremberg (DE); Terunobu Akiyama, Neuchatel (CH)

(73) Assignee: NanoWorld AG, Neuchatel (CH)

( * ) Notice: Subject to any disclaimer, the term of this patent is extended or adjusted under 35 U.S.C. 154(b) by 54 days.

(21) Appl. No.: 10/631,421

(22) Filed: Jul. 30, 2003

(65) Prior Publication Data

US 2004/0266049 A1 Dec. 30, 2004

(30) Foreign Application Priority Data

Jun. 24, 2003 (EP) ........................................... 03014140

(51) Int. Cl.[7] ................................................ G03F 9/00

(52) U.S. Cl. ....................... 438/692; 438/693; 438/694; 430/5; 378/35; 378/34

(58) Field of Search ................................ 438/692, 693, 438/694, 700, 702, 723, 725; 430/5, 322; 378/34, 35

(56) References Cited

U.S. PATENT DOCUMENTS

| | | | | |
|---|---|---|---|---|
| 6,178,221 B1 | * | 1/2001 | Levinson et al. | 378/35 |
| 6,391,523 B1 | * | 5/2002 | Hurditch et al. | 430/280.1 |
| 6,482,553 B1 | * | 11/2002 | Gottert et al. | 430/5 |
| 6,821,896 B1 | * | 11/2004 | Shih | 438/692 |

FOREIGN PATENT DOCUMENTS

| | | |
|---|---|---|
| JP | 09205271 | 8/1997 |

OTHER PUBLICATIONS

An article entitled, "SU–8 Thick Photoresist Processing . . . ,", By Conradie et al., published by J. Micromech. Microeng., vol. 12, (2002), pp. 368–374.

An article entitled "Robust Parylene–To–Silicon Mechanical Anchoring", By Liger et al., published by California Institute of Technology, (2003), pp. 602–605.

* cited by examiner

*Primary Examiner*—Laura M Schillinger
(74) *Attorney, Agent, or Firm*—Bachman & LaPointe, P.C.

(57) ABSTRACT

A micro device comprising a SU-8 photoresist layer adhered to a thin layer of, for example, silicon nitride, silicon oxide, metal, and diamond. The SU-8 layer is clamped on the thin layer by using an under-etching technique.

7 Claims, 5 Drawing Sheets

MICRO DEVICE AND PROCESS FOR PRODUCING IT

FIELD OF THE INVENTION

The present invention relates to micro devices and to a process for producing micro devices of this type.

BACKGROUND OF THE INVENTION

Micro devices are understood as devices belonging to the general field of Micro Electro Mechanical Systems (MEMS), which includes microelectronics (coils, capacitors, dielectric material), micromechanics (sensors, fast prototyping, biochips), microfluidics (Micro Total Analysis Systems ($\mu$TAS) (applications of miniaturized chemical, biochemical and biological systems; micro and nano-scale technologies related to analytical systems, synthesis of compounds, clinical diagnostics, genomics, drug screening, and combinatorial chemistry), micropumps,) and even more.

MEMS industry uses more and more often SU-8 photoresist to define structures on a chip in view of its significant advantages. The SU-8 is a negative, epoxy-type, near-UV photoresist commercially available under this trade name. This photoresist can be as thick as 2 mm and an aspect ratio better than 20 can be achieved with standard contact lithography equipment. That makes it possible to define a significant number of varied structures, which are impossible to realize with other materials. Moreover, it has a very high optical transparency above 360 nm and is thermally stable.

One of the biggest problems of SU-8 photoresist is its adhesion on the layer below. This adhesion depends on the material (of the layer below) but is really affected by the chemical environment. For example, SU-8 delaminates from many surfaces when immersed in KOH (Potassium Hydroxide solution) or TMAH (Tetra Methyl Ammonium Hydroxide solution), whereas it withstands HF (hydrofluoric acid). There are some solutions to improve the adhesion of the SU-8, but none could avoid the lift-off in long KOH or TMAH wet-etching so far.

SUMMARY OF THE INVENTION

Therefore, the present invention is based on the object of proposing a solution to avoid the SU-8 lift-off during a KOH or TMAH. According to the invention, this object is achieved by a micro device for micro electro mechanical systems, comprising at least one layer of SU-8 photoresist which is adhered to a clamping layer with through holes, said through holes are filled with SU-8 photoresist and are covered on both sides with SU-8 photoresist at least adjacent the holes and a process for making the device.

The general idea of the present invention is to clamp the SU-8 photoresist layer on a thin layer below (e.g. silicon nitride, silicon oxide, metal, diamond). Thus, the micro device for micro electro mechanical systems comprises at least one layer of SU-8 photoresist, which is adhered to a clamping layer with through holes. The through holes in the clamping layer are filled with SU-8 photoresist and are covered on both sides with SU-8 photoresist at least adjacent the holes. On the first (upper) side the through holes are covered by the SU-8 photoresist layer and on the second (back) side preferably only by SU-8 in a small region having a diameter larger than the diameter of the through holes for obtaining the clamping effect at the clamping layer. In such a device, which can comprise several micro electro mechanical elements as discussed above, these devices are fixed via SU-8 photoresist. The clamping layer also may have further functions, which are important for the final device. For example, the clamping layer serves as a cantilever that bears a tip at the end and forms together with the SU-8 photoresist layer on the upper side a sensor for a Scanning Probe Microscope (SPM). In such a case, the SU-8 photoresist forms the holding element. The SU-8 photoresist on the backside surrounding the through holes provides a rim, which makes impossible for the SU-8 to lift off during a subsequent wet-etching KOH or TMAH step. These micro devices normally are produced from a wafer and are, when completed, fixed to a frame for transport and breaking off from the frame when needed.

The process according to the present invention for producing such a micro device comprises providing a clamping layer on a silicon substrate (comprising micro electro mechanical elements), transferring of at least a matrix of hole structures into the clamping layer by etching of through holes into said clamping layer, under-etching of the remaining parts of the clamping layer, coating the surface of the clamping layer and the through holes including the under-etched areas of the clamping layer by applying of SU-8 photoresist. The clamping layer may be of the material mentioned above having a thickness depending on the functions that have to be fulfilled by this layer for the MEMS. A common thickness is in the range of 10 nm to 10 $\mu$m. After the application of the clamping layer, the clamping layer is opened by well-known etching methods for defining the design of the clamping layer and a matrix of through holes in this layer. The matrix period and the holes diameter depend of the design of the layer, e.g. period 100 $\mu$m, diameter 50–80 $\mu$m. Next, the layer below the clamping layer is also etched in order to obtain an under-etching of the clamping layer. This step depends on the material under the clamping layer. It is possible to apply the clamping layer directly on the substrate or, on an interlayer between the clamping layer and the substrate in cases, which need for the function of the MEMS such an interlayer. After under-etching, SU-8 is coated with a normal spinner tool upon the surface of the clamping layer and the holes. Finally, it is possible, according to the requirements of the MEMS to remove all the silicon, which is not further necessary, except the silicon frame holding the single micro devices for removing from the frame when needed.

In the case that SU-8 is not able to go under the clamping layer, it is possible to coat two different SU-8 formulations: Thus, according to an embodiment of the invention the process further comprises applying a first SU-8 formulation being very liquid and being able to reach the under-etched areas, followed by a second SU-8 formulation being capable to define the required structures. Thus, the viscosity of the second formulation is less than that of the first, that is, less flowable. The adhesion between two SU-8 layers is generally very good.

According to one embodiment of the invention, the process comprises dry-etching of the clamping layer for providing the through holes, and etching of the silicon substrate in a way that the clamping layer is under-etched.

According to a preferred embodiment of the invention the process comprises providing an interlayer under the clamping layer, wherein the two layers are of different materials, preferably selected from one of the group of silicon compounds, metal or metal compounds or a combination thereof. Etching of the clamping layer performs the forming of the design and the matrix of through holes in the clamping layer. The following wet over-etching of the interlayer permits to create an under-etching of the clamping layer. The viscosity of SU-8 and the thickness of the interlayer define, if a deeper under-etching of the clamping layer is necessary or not. In case that SU-8 is not liquid enough to flow under the clamping layer after the over-etching of interlayer, the silicon substrate is wet-etched.

Preferably the process comprises finally removing of the silicon substrate as far as it is not further necessary from the backside and, if existing accessible, removing of the interlayer.

BRIEF DESCRIPTION OF THE DRAWINGS

In the following the invention is explained in more detail below with reference to exemplary embodiments shown in the figures, in which.

DETAILED DESCRIPTION OF A PREFERRED EMBODIMENT

Figure 1:
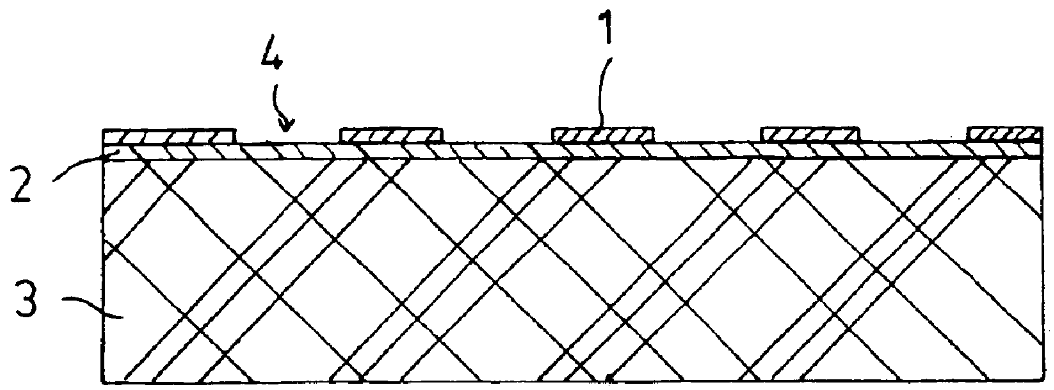
FIGS. 1–6 show cross-sectional illustrations of the process for producing a micro device of this type for forming a micro device.

FIG. 1 shows a silicon substrate 3 with a clamping layer 1 and an interlayer 2 between substrate 3 and clamping layer 1. The clamping layer 1 is in this embodiment of silicon nitride and the interlayer is of silicon oxide. The clamping layer 1 is already opened by a well-known dry-etching process forming holes 4 into the surface of the clamping layer 1.

Figure 2:
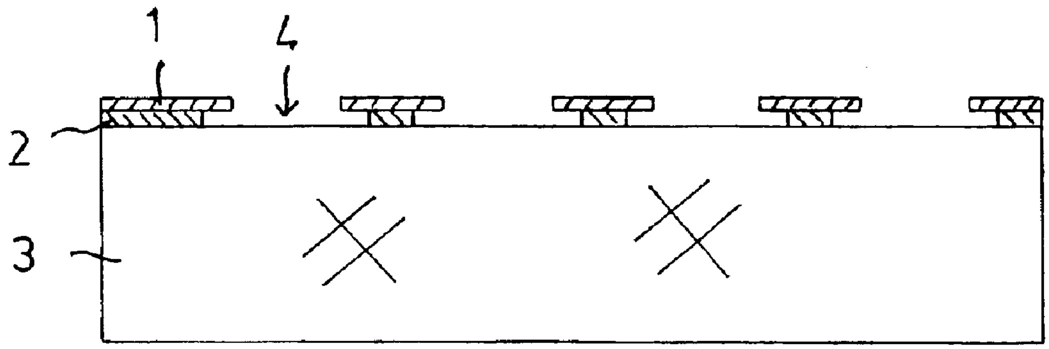

In FIG. 2 the interlayer 2 is wet over-etched thereby providing an under-etching of the clamping layer 1.

Figure 3:
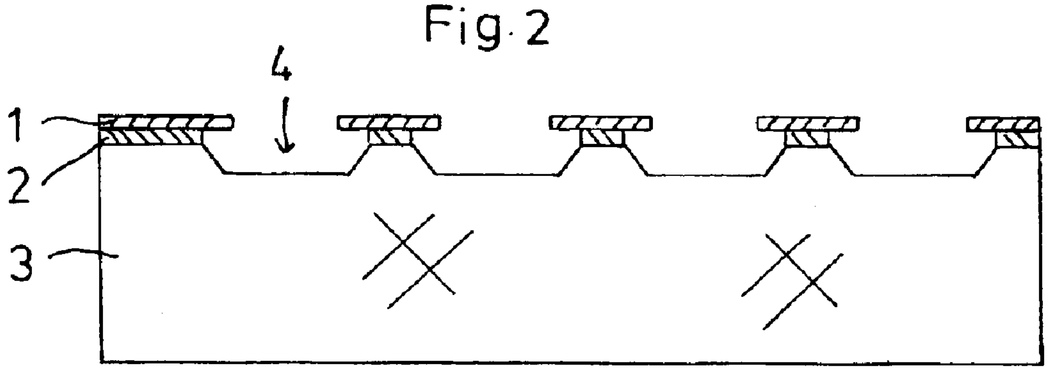

Next, the silicon is wet-etched with KOH as shown in FIG. 3. This step is only necessary, as mentioned above, if SU-8 is not liquid enough to flow under the clamping layer 1.

Figure 4:
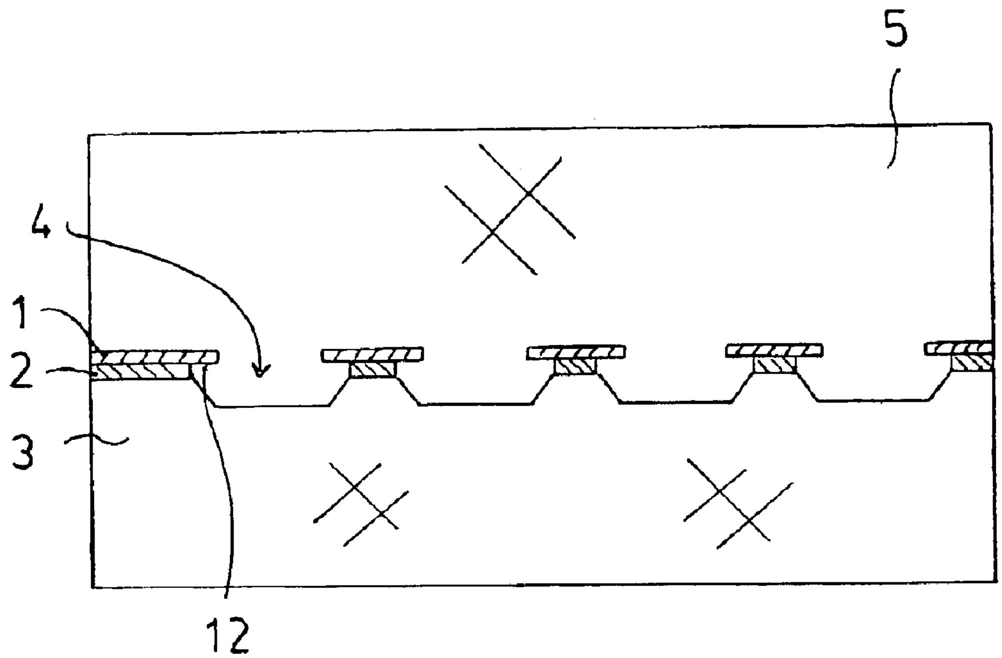

FIG. 4 shows the structure of FIG. 3 coated with a SU-8 layer 5 thereby also filling the area under the clamping layer 1 and forming a rim 12, which prevents moving of SU-8 in the vertical direction.

Figure 5:
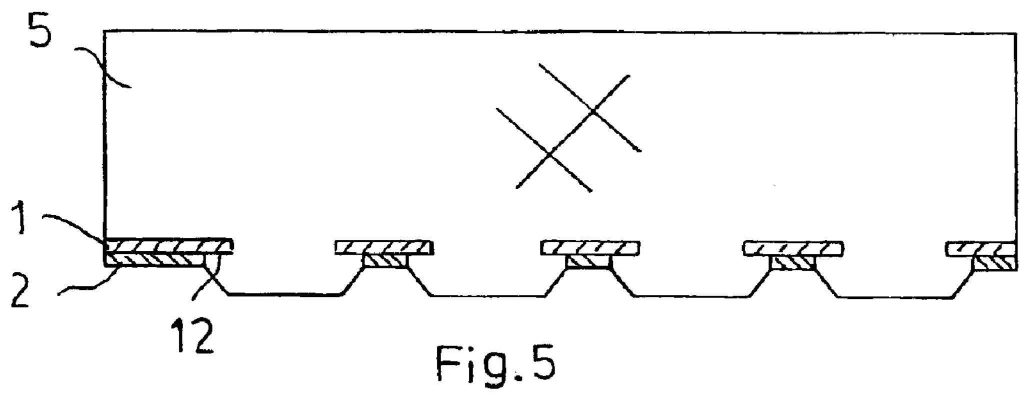
Figure 6:
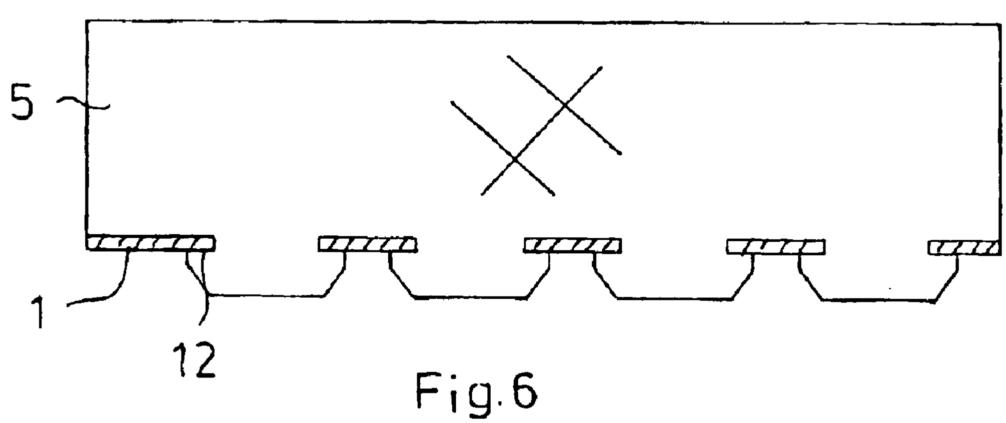

The final steps are shown in FIGS. 5 and 6 in which the silicon substrate 3 is wet-etched by KOH and then the interlayer 2 made of silicon oxide is removed by a buffered hydrofluoric acid (BHF).

Figure 7A:
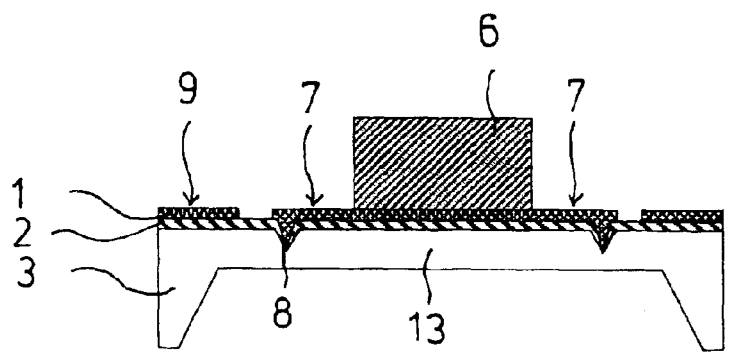
FIGS. 7–8 show sectional illustrations of a hybrid sensor SPM sensor assembly as an embodiment of the structures depicted in FIGS. 1 to 6.
Figure 7B:
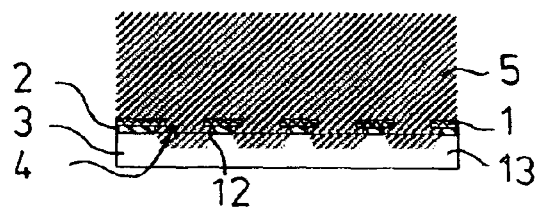
Figure 7C:
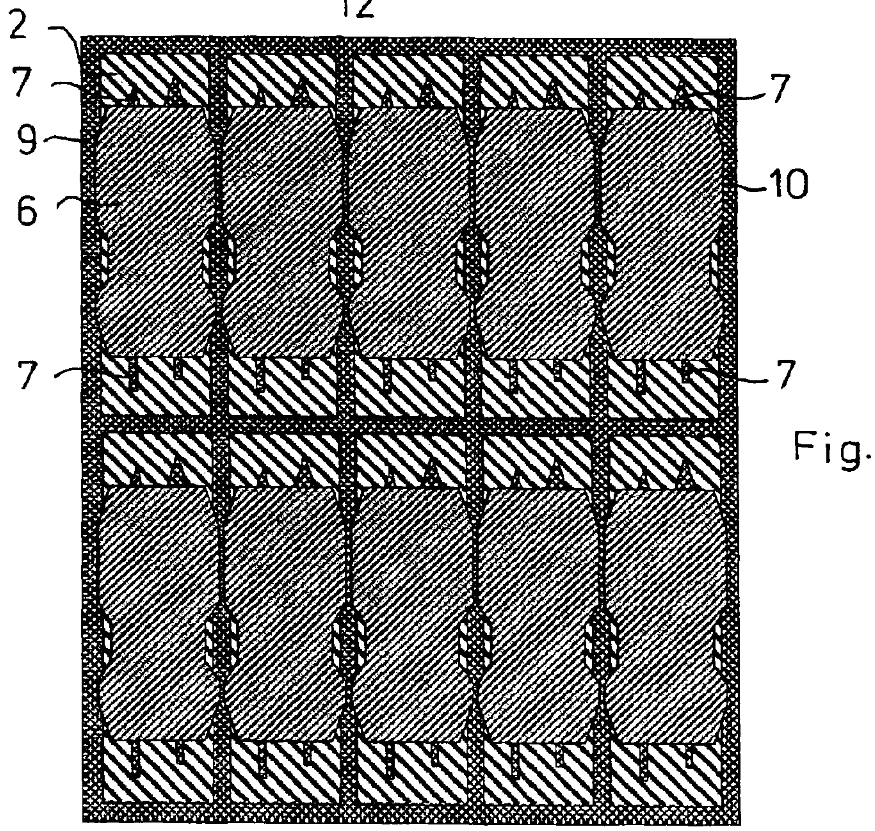

FIG. 7 shows the situation according to FIG. 4 with the SU-8 layer 5 applied to the entire wafer (substrate (Si)) in order to form a SPM sensor with a holding element 6 made of SU-8 and a cantilever 7 with a tip 8 at the end. The cantilever 7 and the tip 8 are made of material of the clamping layer 1 (SiN). The interlayer 2 ($SiO_2$) is used for forming and sharpening the tip 8. The layer 5 is photolithographically patterned in the usual way to form the holding element 6. FIG. 7A shows the cross-sectional view of the holding element 6 on the clamping layer 1 forming two cantilevers 7 with tips 8. The interlayer 2 is shown between the clamping layer 1 and the membrane 13 of the substrate 3. FIG. 7B shows the excerpt-enlargement of the SU-8 layer 5 on the clamping layer 1 with the holes 4 and the membrane 13 according to FIG. 4. FIG. 7C shows the top view on a silicon frame 9 with the holders 10 and holding elements 6 with four cantilevers 7. The cantilevers have different shapes (triangular and rectangular) and different lengths. Each cantilever has a tip at its end. This allows the customer to decide which cantilever he wants to use. In this embodiment the holders 10 for fixing the micro device (SPM sensor) to the frame 9 are included in the holding element 6.

Figure 8A:
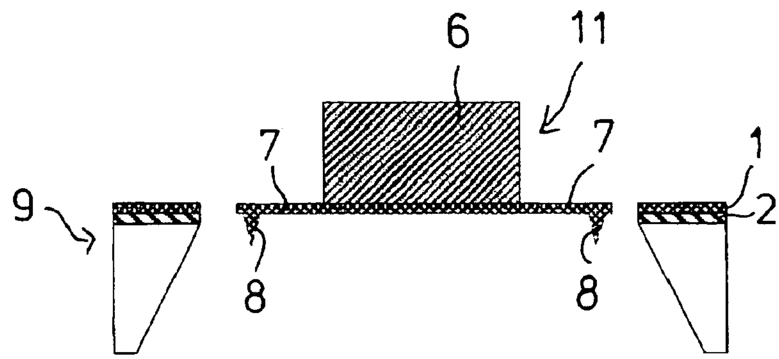
Figure 8B:
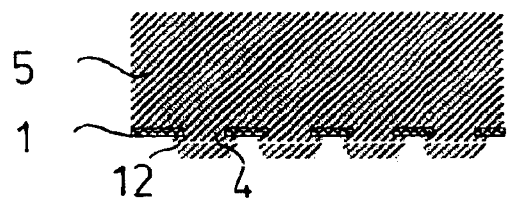
Figure 8C:
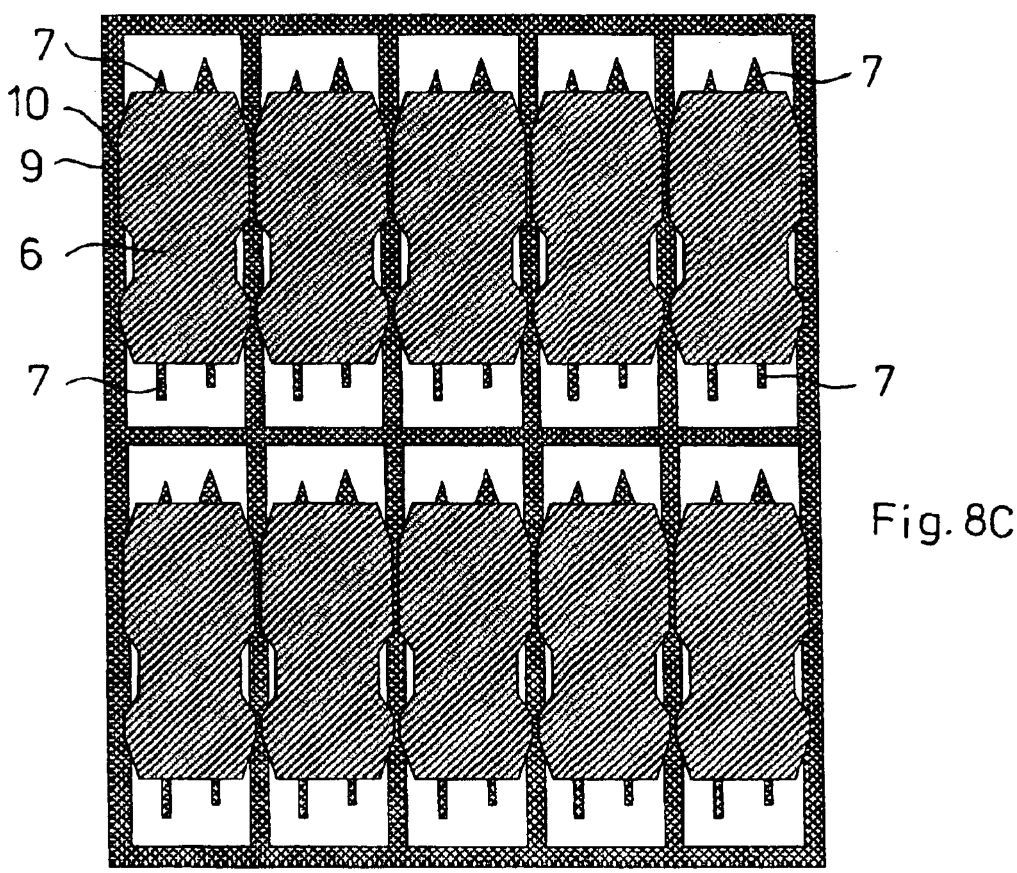
Figure 9:
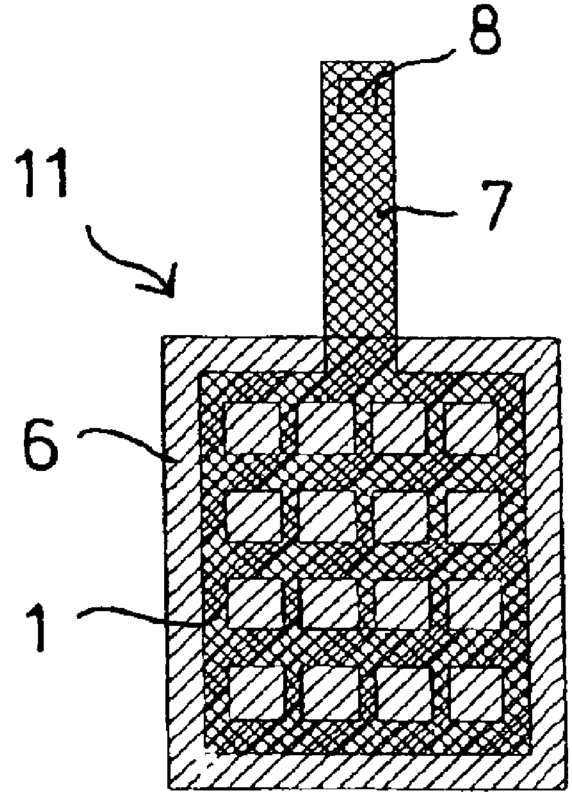
FIG. 9 shows a plan view of an SPM sensor with improved adhesion between the cantilever layer material and the holding element according to the invention.

For obtaining the SPM sensor 11 with the holding element 6 made of SU-8, the cantilever 7 and the tip 8 the silicon substrate 3 is etched from the backside of the substrate 3 (in KOH) until the silicon membrane 13 is open (according to FIG. 5). The finished SPM sensor (FIG. 8A) is then obtained by removal of the interlayer 2, which is used as a sacrificial layer, in this case made of silicon oxide, by means of BHF. FIG. 8B shows the respective excerpt-enlargement according to FIG. 6. FIG. 8C shows for example a plan view of the finished frame 9 with the holders 10 and the SPM sensors located therein in plan view, illustrating the holding element 6, and, for example, also the frame 9 and the holders 10 included in the holding element 6, as it can be sold. FIG. 9 finally shows a SPM sensor with the holding element the cantilever 7 and the tip 8 with the clamping layer 1 having holes 4 with the SU-8 forming a rim 12 as shown in figures to 6 so that the SU-8 photoresist links to the silicon nitride clamping layer 1 which also forms the cantilever 7.

What is claimed is:

1. A process for producing a micro device for micro electro mechanical systems, comprising the following steps:

providing a clamping layer (1) on a substrate (3);

forming at least a matrix of hole (4) into the clamping layer (1) by etching of the holes (4) into said clamping layer (1);

lateral under-etching of the remaining parts of the clamping layer (1) to form lateral under-etched areas of the clamping layer; and coating a surface of the clamping layer (1) and the holes (4) including the lateral under-etched areas of the clamping layer by applying SU-8 photoresist, wherein the SU-8 photoresist is mechanically fixed to the holes and the lateral under-etched area.

2. A process as claimed in claim 1, comprising applying a first SU-8 formulation as a liquid capable of reaching the under-etched areas, followed by a second SU-8 formulation being capable of forming a solid structure.

3. A process as claimed in claim 1, comprising etching of the clamping layer (1) for providing the through holes (4), etching of the substrate (3) for transferring the structures of the clamping layer (1) into the substrate and subsequently under-etching the clamping layer.

4. A process as claimed in claim 1, comprising providing an interlayer (2) on the clamping layer (1), wherein the two layers are of different materials selected from the group consisting of silicon compounds, metal, metal compounds and mixtures thereof.

5. A process as claimed in claim 4, comprising etching of the clamping layer (1) followed by an over-etching of the interlayer.

6. A process as claimed in claim 5, comprising etching of the substrate, so that the clamping layer (1) is under-etched.

7. A process as claimed in claim 1, comprising removing a part of the substrate.

* * * * *